United States Patent
Nakajima et al.

(10) Patent No.: US 6,610,373 B2
(45) Date of Patent: Aug. 26, 2003

(54) MAGNETIC FILM-FORMING DEVICE AND METHOD

(75) Inventors: Daisuke Nakajima, Tokyo (JP); Koji Tsunekawa, Tokyo (JP); Naoki Watanabe, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/972,919

(22) Filed: Oct. 10, 2001

(65) Prior Publication Data

US 2002/0064594 A1 May 30, 2002

(30) Foreign Application Priority Data

Oct. 10, 2000 (JP) .......................... 2000-309327

(51) Int. Cl.[7] .............................. C23C 14/02
(52) U.S. Cl. ................. 427/534; 427/128; 427/129; 427/130; 427/209; 427/250; 427/255.23; 427/255.26; 427/294; 427/296; 427/307; 427/322; 427/327; 427/532; 427/535; 427/536; 427/537; 427/539; 427/540; 427/569; 427/575; 427/576; 427/580; 118/72; 118/620
(58) Field of Search ................. 427/532, 534, 427/535, 536, 537, 539, 540, 569, 575, 576, 580, 209, 250, 255.23, 255.26, 294, 296, 307, 322, 327, 128–130; 118/620, 72

(56) References Cited

U.S. PATENT DOCUMENTS 4,962,049 A    10/1990   Chang et al.
5,322,716 A *   6/1994   Takahashi et al. .......... 427/535
6,059,985 A    5/2000   Yoshimura et al.

OTHER PUBLICATIONS

"Plasma Cleaning and Applications for Semiconductor Assembly Process"; J. Vac. Soc. Jpn, vol. 43, Nov. 6, 2000, pp. 647–653, (full translated document is attached).

* cited by examiner

Primary Examiner—Bernard Pianalto
(74) Attorney, Agent, or Firm—Burns, Doane, Swecker & Mathis, LLP

(57) ABSTRACT

In a device for forming magnetic film which deposits magnetic material on a substrate 12, a device is provided which, before the magnetic film is formed in a magnetic film-forming chamber 11, cleans one or both of the film-forming face and reverse face of the substrate 12 in a cleaning processing chamber 13. The cleaning mechanism carries out cleaning by placing a substrate on a horseshoe-shaped insulator substrate-holding part 51 which moves up and down, and emission of gas from the reverse face of the substrate and the like is brought about by generating Ar plasma between the upper periphery of the substrate, the substrate and a lower insulator 61 of the substrate.

21 Claims, 11 Drawing Sheets

MR: Magnetoresistance
R: Resistance value

MAGNETIC FILM-FORMING DEVICE AND METHOD

CROSS REFERENCE TO RELATED APPLICATIONS

The present application claims the priority of Japanese Patent Application No. 2000-309327, which was filed in Japan on Oct. 10, 2000, the entire contents of which is hereby incorporated herein by reference.

BACKGROUND OF THE INVENTION

1. Field of the Invention

The present invention applies to a magnetic film-forming device and method, and in particular, to a magnetic film-forming device and method which is applied in the production of giant magnetoresistive (GMR) heads and the like which have excellent magnetic film characteristics.

2. Discussion of Related Art

The formation of magnetic film is important in the manufacture of magnetic recording media such as hard disks and magnetic heads. When such magnetic films are formed it is preferable to form a film in which the magnetism can easily be changed to a specific direction. This will be explained below for the example of a magnetic head.

The surface recording density of hard disk devices (HDD) has improved at an astonishing rate in recent years. At present, surface recording densities of 20 to 35 Gbits/inch$^2$ are being achieved and it is said that by the year 2002 this will become 80 Gbits/inch$^2$ and 100 Gbits/inch$^2$ in the future. Reasons for this improvement in surface density are considered to be the fact that the elements of the recording media and magnetic head are converted to thin film, and the gap between the magnetic head (recording head and playback head) and the magnetic recording medium is reduced. With regard to the development of such playback heads, in order to further improve the surface density, there has also been progress in the development of the present GMR (giant magnetoresistive) heads into TMR (tunneling magnetoresistive) heads.

The films which form the elements of the GMR head and TMR head are respectively called GMR film and TMR film. The structures of the GMR film 101 and TMR film 102 are shown in outline in FIGS. 11(A) and 11(B). These films 101, 102 have a multilayer film structure of what is referred to as the spin bulb type in which an extremely thin nonmagnetic layer 103 or an insulator layer 104 is sandwiched between two magnetic layers (a pin layer 105 with a fixed direction of magnetization and a free layer 106 whose direction of magnetization is determined by an applied external magnetizing force). In other words, the multilayer film structure of the spin bulb type makes use of a phenomenon in which the resistance is changed by means of the direction of the magnetization of the magnetic film due to different magnetic properties of the two layers (magnetoresistive effect or MR effect), and is structured in such a way that the direction of magnetism of only one of the two layers changes as a result of a change in the external magnetizing force. For example, the direction of magnetization of a magnetic layer (pin layer 105) which contacts an antiferromagnetic layer 107 such as FeMn, on top of a magnetic layer is fixed and another magnetic layer (free layer 106) is placed in a state in which it cannot adopt a particular direction of magnetization. It is to be noted that the uppermost layer of the GMR film 101 and TMR film 102 is in any case formed as an antiferromagnetic layer 107.

When a magnetic field which is generated from the magnetic recording medium is applied to the multilayer film structure part, the direction of magnetization of the free layer 106 is changed in accordance with the direction of that magnetic field and the electrical resistance of the element film changes. In the GMR head 101, an electric current is made to flow in the inward direction using Cu in the nonmagnetic layer 103. In contrast, in the TMR head 102, an insulator film 104 such as $Al_2O_3$ is used as the nonmagnetic layer and when a current is made to flow in the vertical direction of the element film, the resistance value changes and this can be used as playback output.

FIG. 12 is an enlarged view of the main film structures of a magnetic head (GMR head) seen from the underside. A coil 203 formed from Cu is provided on top of a lower magnetic pole (upper shield) 202, and an upper magnetic pole 204 is provided on the coil 203. In a multilayer film 206 in which a portion 205 is shown enlarged, a recording gap ($Al_2O_3$) 207 is formed between the lower magnetic pole 202 and the upper magnetic pole 204, an intermediate film 208 is formed on both sides of the upper magnetic pole 204, and a protective film 209 ($Al_2O_3$) is formed on the intermediate film 208. In addition, a substrate-protecting film 211 is formed on a substrate 210 and a lower shield 212 is formed on the substrate-protecting film 211. A playback element (GMR film) 214 is formed in the center on top of the lower shield 212 with the interposition of a playback lower gap ($Al_2O_3$) 213. A hard bias 215 is provided on both sides of the playback element 214. An electrode 216 is formed on the hard bias 215. The lower magnetic pole 202 is formed on the electrode 216, and the central playback element 214, with a interposition of a playback upper gap 217.

As mentioned above, in recent years, in order to improve the surface density it has been necessary to convert to thin film the recording gap 207 between the upper magnetic pole 204 and the lower magnetic pole 202, and the playback upper gap 217 and the playback lower gap 213 between the upper shield (lower magnetic pole) 202 and the lower shield 212. For example, in order to sandwich the playback upper gap 217 etc., it has been necessary to make the actual playback element (GMR film) 214 thinner. However, there is the problem that if the film of the playback element 214 is made thinner and the element width corresponding to the track width (W1 in FIG. 12) of the playback element 214 is sandwiched, the resistance value becomes larger.

Also, in order to improve the output characteristics, it is necessary for the rate of change of resistance (MR ratio) corresponding to the change in the magnetic field shown in the formula below (1) to become large.

$$MR(\%) = (Rmax - Rmin)/Rmin = \Delta R/Rmin = \Delta \rho / \rho \tag{1}$$

Rmax: electrical resistance value measured in the same direction of the electric current as the change in magnetization of the element film Rmin: electrical resistance value measured in the direction of the electric current perpendicular to the direction of the change in magnetization of the element film $\rho$: resistivity=$R \times t$ t: film thickness $\Delta \rho$: change in resistivity value As shown in FIG. 13, the resistance value (R) is reduced as a function of the drop in pressure (base pressure) in the vacuum chamber. At this time, the rate of change of the resistance, MR, increases and an increase by 8% is obtained at $1 \times 10^{-7}$(1E–7) Pa or above. Because this is the case, it is assumed that, in order to obtain a film with excellent magnetism characteristics with a high MR ratio, the resistivity value (ρ) of the film must be low.

As mentioned above, in order to make the element film thickness of the multilayer film structure into thin film, it is necessary to deposit the structural films to an approximate thickness of several nm with a high degree of uniformity of the thickness of the film and methods which slow down the disposition rate are adopted. However, slowing down the disposition rate makes it easy for impurities to enter the film, giving rise to a film with a high resistance value (R), in other words, a high resistivity value (ρ), and it is difficult to obtain a film with excellent magnetic properties as hoped. For this reason, there is a need for a magnetic film-forming device with which it is possible to obtain an extremely good vacuum.

Furthermore, MRAMs (Magnetic Random Access Memories) have aroused interest as non-volatile memories which have the large capacity of DRAMs, the speed of SRAMs and are rewritable. The basic structure of these MRAMs in transistor integrated circuits formed by means of conductor manufacturing processes is one in which the above-mentioned TMR elements and GMR elements with a large magnetoresistive change ratio are formed at specific locations corresponding to individual transistors.

The TMR elements in the MRAM structure have an approximate structure as shown in the above-mentioned FIG. 11(B), and they are formed so as to be positioned at the intersection points of the bit lines and rewritable word lines. In this configuration, when electric current is made to flow in the bit lines and rewritable word lines, the magnetization of the free layers of only those elements which receive the influence of the magnetic field from both bit lines and rewritable word lines is reversed. A "1" or "0" information item can be written as a function of whether or not the magnetization of the free layer is reversed in this way. However, if the change in direction of the magnetization of the two magnetic layers comprising the pin layer and the free layer is the same when current is made to flow in the bit lines, the resistance value drops to a minimum, and when the changes in direction of magnetization are opposed, the resistance value rises to a maximum. Therefore, the change in resistance (change in voltage) generated by causing current to flow in the bit lines and bringing about a tunnel current through the insulator film, such as $Al_2O_3$, between the two magnetic layers is detected, and in this way a "1" or "0" information item can be read.

When the MRAMs are manufactured, firstly an integrated circuit is formed on a silicon substrate using a semiconductor manufacturing process. Next, a TMR film or GMR film is formed on the substrate. In other words a sequence composed of magnetic film/insulator film/magnetic film is deposited in the magnetic film-forming device. In this process, as mentioned above, a low film resistivity value (ρ) is important for obtaining a film with excellent magnetic properties and a high MR ratio. To do this, it is necessary to have an extremely high vacuum in the magnetic film-forming chamber.

OBJECTS AND SUMMARY

In a magnetic film-forming device, the substrate is usually conveyed into a cleaning chamber before the magnetic film is formed, and the formation of film is then prepared by preparatory evacuation of the cleaning chamber. After the cleaning chamber has been evacuated to a specific degree of vacuum (for example $5.0 \times 10^{-4}$ Pa), the gate valve between the cleaning chamber and the magnetic film-forming chamber is opened and the substrate is conveyed into the magnetic film-forming chamber. However, a large amount of gas is emitted from substrates which have been processed in order to form integrated circuits. For this reason, if the cleaning chamber is evacuated using, for example, a TMP (turbo molecular pump) with a pumping speed of 300 L/s, it usually takes 15 minutes to achieve a specific degree of vacuum of $5.0 \times 10^{-4}$ Pa, whereas with substrates processed as mentioned above, the time taken is 30 minutes to 50 minutes, in other words two to three times as long.

In order to overcome this problem, in the prior art, prior to deposition of the magnetic film, gas was emitted by heating the substrate, or the front face of the substrate was cleaned by generating plasma such as Ar. However, in substrate-heating methods, the substrate is heated by means of a heat source such as a heater or lamp and the adsorption gas in the moisture and the like which is adsorbed into the front face of the substrate was eliminated but metal impurities in the front face layer were not removed. Furthermore, during cleaning by means of plasma such as Ar, it was possible to remove surface materials which affect the film quality of the magnetic film such as adsorption gas molecules on the film-forming face of the substrate and surface oxides, but it was not possible to remove impurities in the reverse face.

In view of the above, a method for plasma-cleaning the reverse face of a substrate was developed and is disclosed in Japanese Laid-Open Patent Application No. H9-283459 and U.S. Pat. No. 4,962,049.

However, none of these methods has been capable of both removing adsorption gas molecules from the entirety of the substrate and removing impurities from the magnetic film-forming front face within a short time.

An object of the present invention is to overcome the above-mentioned problems by providing a magnetic film-forming device and method in which, by means of measures either before or during the deposition of magnetic film on the substrate during the manufacture of multilayer films such as a GMR film on a substrate, in particular, the emission of gas from the reverse face of the substrate is promoted, the quality of the film during the continuous substrate film-forming process is improved and stabilized, and throughput and productivity are increased and the magnetic properties are improved.

A magnetic film-forming device according to one aspect of the present invention is a device which deposits magnetic material on a substrate and forms a magnetic film, and is configured in such a way that it is provided with a mechanism which, before the magnetic film is formed, cleans either one or both of the film-forming face and reverse face of the substrate.

In the magnetic film-forming device having the configuration in which the substrate is cleaned using Ar plasma, or the like, by means of measures carried out before the formation of magnetic film on the reverse face of the processed substrate, the device is configured such that when this cleaning process is carried out, cleaning is performed by causing gas to be emitted from both the film-forming face of the front side of the substrate and from the reverse face of the substrate. By this means, it is possible to reliably maintain an extremely high vacuum in the film-forming environment of the magnetic film-forming chamber by reducing the emission of gas from the substrate during the formation of the magnetic film on the substrate. In addition, by shortening the time necessary for evacuation it is possible to achieve an extremely high vacuum in a short time. This improves the quality of the film and increases productivity.

In another aspect of a magnetic film-forming device according to the present invention in the above-mentioned configuration, a cleaning processing chamber which is provided with a cleaning device is preferably installed between a load lock chamber into which the substrate is introduced and a magnetic film-forming chamber in which the magnetic film is formed on the substrate, and the load lock chamber and the cleaning processing chamber, and the cleaning processing chamber and the magnetic film-forming chamber are respectively connected in an airtight fashion and the cleaning of the substrate and the formation of magnetic film on the substrate are carried out continuously without the substrate being exposed to the atmosphere. In this configuration, the effect of maintaining air-tightness in the chambers makes it respectively possible to maintain a high vacuum. In addition, preventing exposure to the atmosphere when carrying out the measures during the processing of the substrate contributes to maintaining a high vacuum state.

In another aspect of a magnetic film-forming device according to the present invention, the cleaning processing chamber described above is preferably provided with a high frequency power supplying device which applies high frequency power to the substrate. In the cleaning processing chamber, an Ar gas, or the like, is introduced and the substrate is cleaned by generating plasma by applying high frequency power to the gas.

In yet another aspect of a magnetic film-forming device according to the present invention, the high frequency power supplying device is preferably provided with a horseshoe-shaped insulator substrate-holding part which is capable of moving up and down. By moving the substrate-holding part which is formed by an insulator, the reverse face of the substrate which is mounted in the substrate-holding part is exposed to plasma and it is possible to clean the reverse face of the substrate.

According to another aspect of the present invention, the high frequency power supplying device is preferably provided with an insulator part which is arranged on the lower part of the substrate-holding part.

According to yet another aspect of the present invention, quartz is preferably used in the insulator substrate-holding part and the insulator.

A magnetic film-forming method according to one aspect of the present invention includes depositing magnetic material on a substrate to form a magnetic film, and before the magnetic film is formed, either one or both of the magnetic film-forming face and the reverse face of the substrate are cleaned. During this magnetic film-forming method, the reverse face of the substrate may be cleaned by means of measures carried out before the formation of magnetic film.

In another aspect of a magnetic film-forming method according to the present invention, the cleaning and magnetic film formation are preferably carried out at different places.

Furthermore, in yet another aspect of a magnetic film-forming method of the present invention, the cleaning is preferably carried out by applying high frequency power to the substrate.

DETAILED DESCRIPTION OF THE PREFERRED EMBODIMENTS

Figure 1:
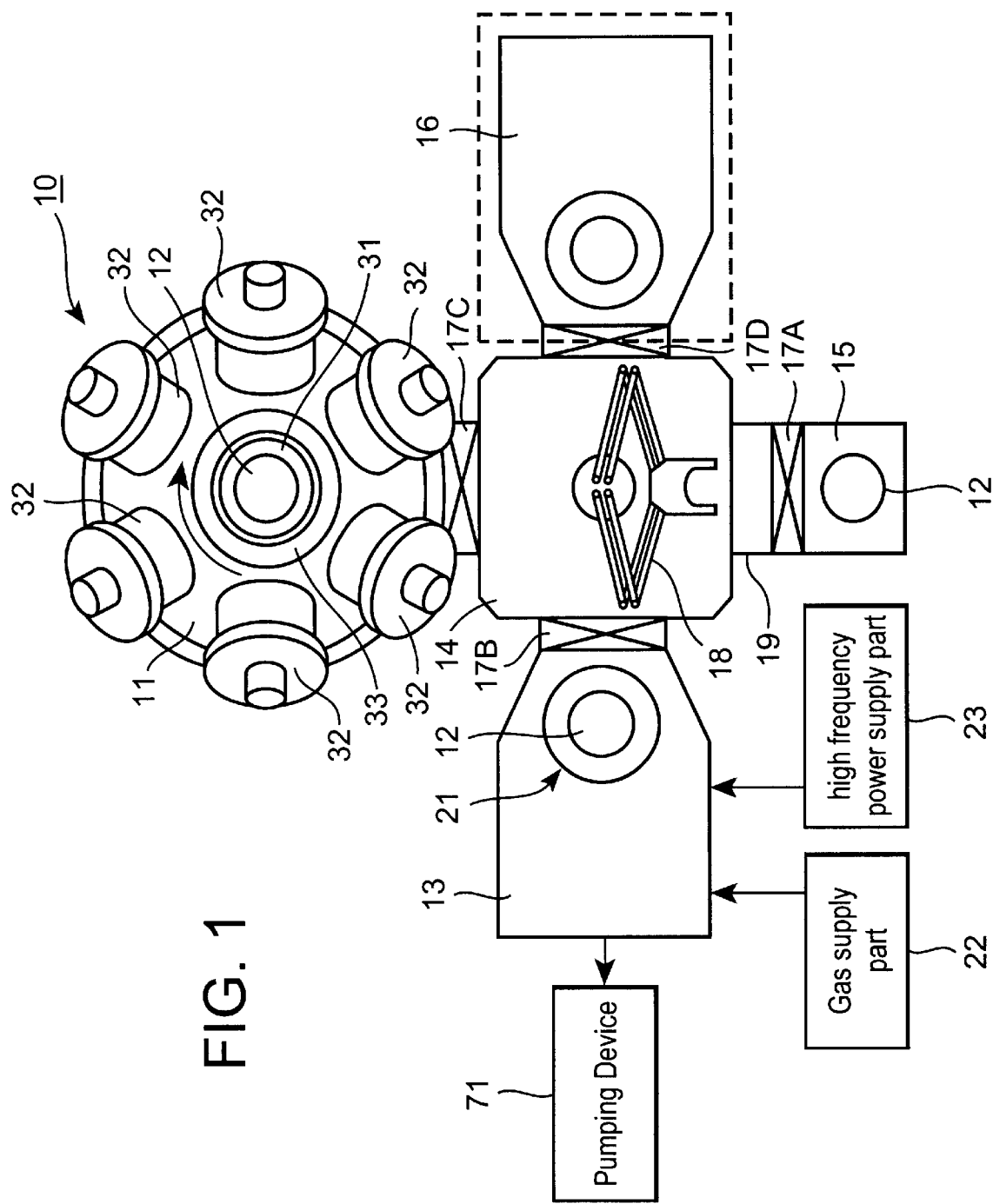
FIG. 1 is a plan view showing in outline the overall configuration of a magnetic film-forming device relating to the present invention.
Figure 2:
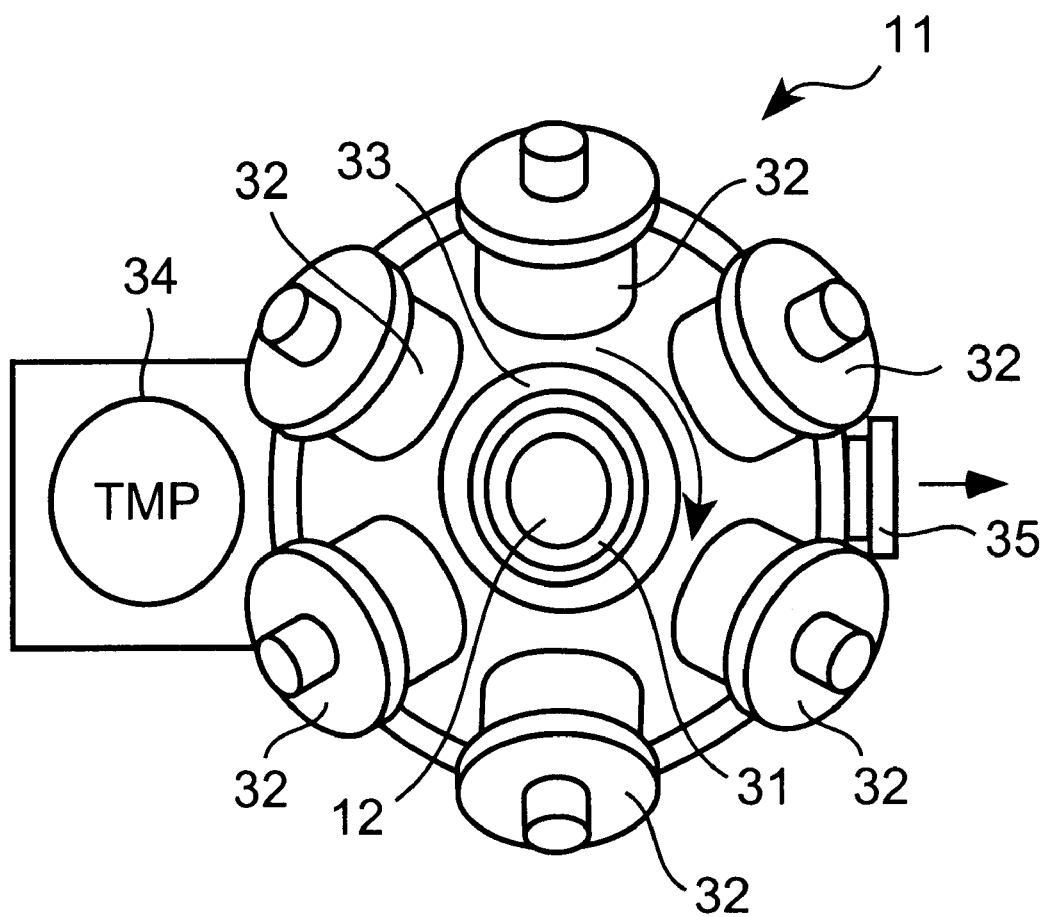
FIG. 2 is a plan view showing the structure of the main elements of a magnetic film-forming chamber of the magnetic film-forming device according to the present invention.
Figure 3:
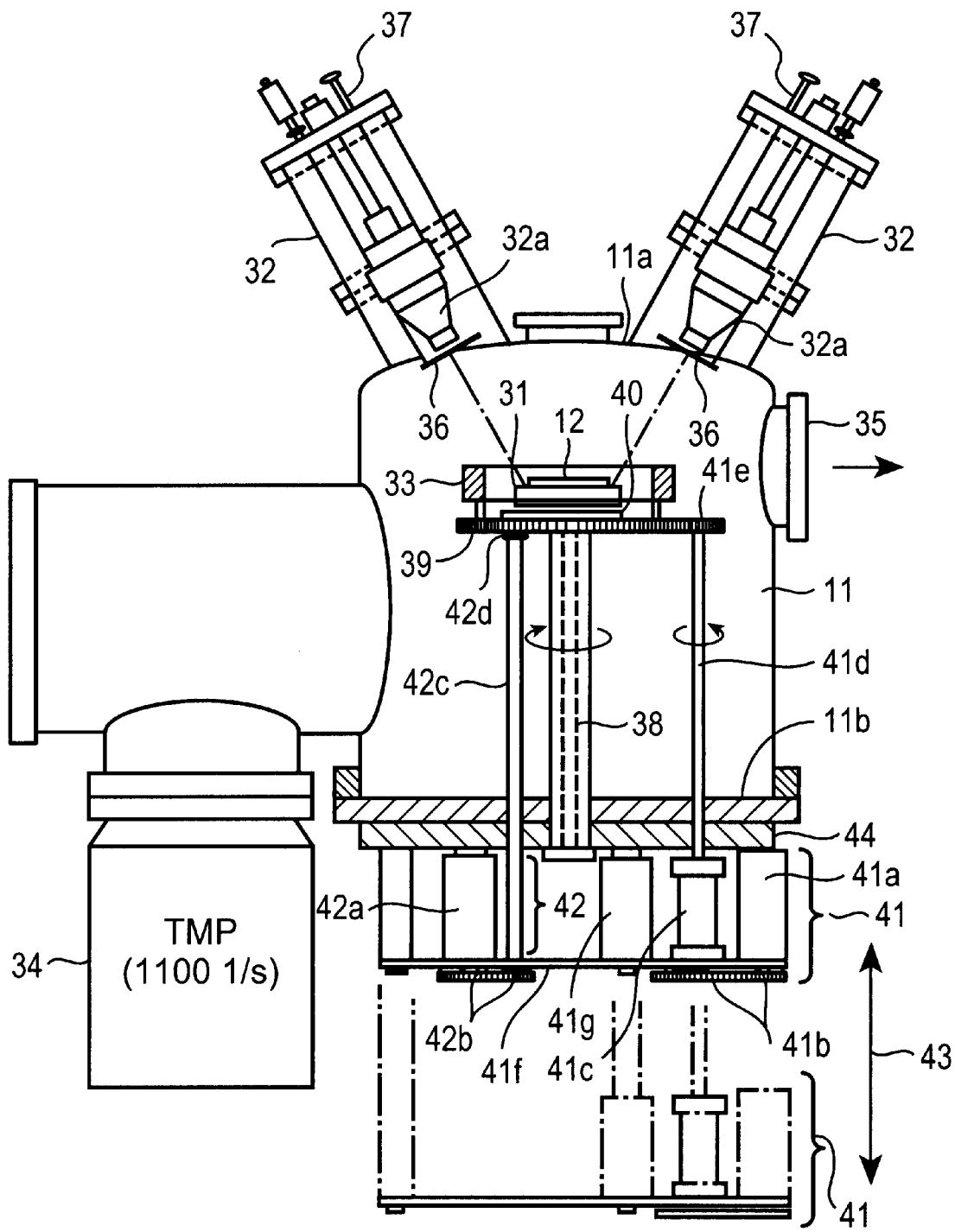
FIG. 3 is a sectional side view showing the main elements of the interior configuration of a magnetic film-forming chamber according to the present invention.
Figure 4:
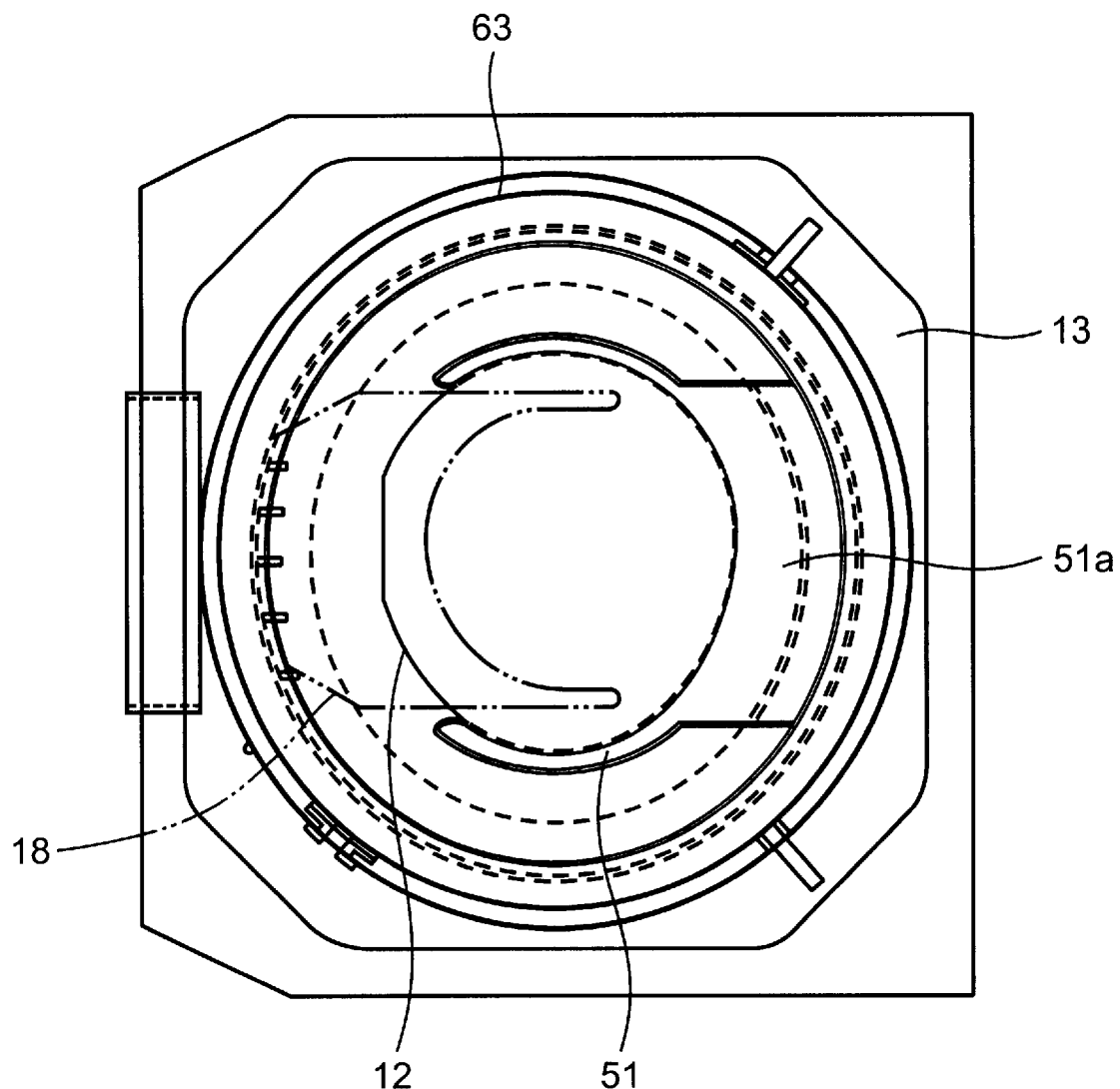
FIG. 4 is a plan view showing the interior structure of a cleaning processing chamber according to the present invention.

FIGS. 1 to 3 show a representative embodiment of a magnetic film-forming device according to the present invention. FIG. 1 is a plan view of a magnetic film-forming device according to one embodiment of the present invention, FIG. 2 is a plan view of a magnetic film-forming chamber, and FIG. 3 is a lateral vertical section showing the internal structure of a magnetic film-forming chamber.

In the magnetic film-forming device 10 according to one embodiment of the present invention, plasma cleaning is carried out in a cleaning processing chamber 13 by means of, for example, Ar plasma on one or both of the front face and reverse face of the substrate 12 before magnetic film is deposited on the front face (film-forming face) of the substrate 12 in the magnetic film-forming chamber 11.

The magnetic film-forming device 10 is provided with a central conveying chamber 14, a magnetic film-forming chamber 11 installed at its periphery, a cleaning processing chamber 13, a load lock chamber 15, and another processing chamber 16. Gate valves 17A to 17D are provided between the central conveying chamber 14 and the other chambers at its periphery. The other processing chamber 16 is an optional chamber. In the central conveying chamber 14, a conveying robot arm 18 is provided for moving substrates 12 within the chamber. The robot arm 18 can rotate its whole body freely about a central axis and freely extend and retract by means of the arm part and move while holding substrates in its hand part at the end of the arm part. In the state in which the gate valves 17A to 17D are open, the robot arm 18 can enter the chambers on the periphery from the central processing chamber 14 on the basis of its rotational and extension and retraction movements and put in and take out substrates. It is to be noted that an aligner 19 is provided between the central conveying chamber 14 and the gate valve 17A for the load lock chamber.

A pumping device for forming the required vacuum in the interior of the chamber, a drive device which brings about the rotational and extension and retraction movements of the robot arm 18, and a control device are provided in a lower part of the central conveying chamber 14.

A substrate 12 which is conveyed into the load lock chamber 15 from the outside and on which magnetic film is to be deposited is arranged in a standby state. Magnetic film is formed on this substrate 12 in the magnetic film-forming chamber 11, and one or both of the front face and reverse face of the substrate 12 are cleaned by means of prior measures in the cleaning processing chamber 13.

Therefore, firstly, by opening the gate valve 17A, the substrate 12 which is waiting in the load lock chamber 15 is taken out by the robot arm 18 and introduced into the cleaning processing chamber 13 by opening the gate valve 17B.

A substrate-holding device 21 which holds the substrate 12 inside the cleaning processing chamber 13 is provided, and the substrate 12 is mounted thereon. The substrate-holding device 21 will be explained in detail below. A gas supply part 22 which supplies Ar gas and a high frequency power supply part 23 which supplies high frequency power are provided in the cleaning processing chamber 13. A pumping device 71 (vacuum pump), a cooling device, and various kinds of drive devices are provided in an upper part of the cleaning processing chamber 13.

The substrate 12 is mounted on a substrate-holding platform 31 in the magnetic film-forming chamber 11. Six cathode units 32 are arranged at equal intervals on the upper side ceiling part at a circular position which is coaxial with the substrate-holding platform 31. In addition, a permanent magnet 33 in the shape of a ring is provided surrounding the circumference of the substrate 12. The substrate-holding platform 31, the substrate 12 mounted thereon, and the permanent magnet 33, which is installed by connecting it to the substrate-holding platform 31 are respectively installed so that they can rotate.

As shown in FIGS. 2 and 3, a pumping device (vacuum pump: TMP) 34 is connected to the magnetic film-forming device 11. The interior of the magnetic film-forming chamber 11 is evacuated by means of this pumping device 34 when the gate valve 17C is in the opened state, to form an extremely high vacuum of, for example, approximately $1 \times 10^{-7}$ Pa, or less. The gate valve 17C is installed in an inlet/outlet opening 35, and substrates 12 are put in and taken out through this inlet/outlet opening 35.

The structure of the cathode units 32 which are mounted on the ceiling part 11a of the magnetic film-forming chamber 11 is shown in outline in FIG. 3. A Ta target for forming a protective cap layer and buffer layer with a diameter of 7.1 inches, an FeMn target for forming an antiferromagnetic layer, a target made of Co and CoFe for forming a ferromagnetic layer, a Cu target for forming a conductive non-magnetic layer and an NiFe target for forming a soft magnetic layer are installed in each of the six cathode units 32. In the cathode units 32, 32a is the cathode. A shutter 36 is installed on a front side of the cathode 32a, and it is opened and closed according to requirements during the film-making process. In addition, a gas injection part 37 is provided in the cathode unit 32.

Furthermore, as shown in FIG. 3, a support 38 is installed in a center of the base part 11b of the magnetic film-forming chamber 11. The substrate 12 is mounted on the substrate-holding platform 31, which is provided on an upper part of the support 38. The support 38 is installed so that it can freely rotate. The substrate-holding platform 31 also functions as a substrate heater. A flat gearwheel 40 is fixed to the underside of the substrate-holding platform 31 by the support 38. Furthermore, a ring-shaped support plate 39 is installed in a freely rotating state on the circumference of the flat gearwheel 40 on the underside of the substrate-holding platform 31. The edge of the ring-shaped support plate 39 is indented, and the ring-shaped support plate 39 functions as a ring-shaped flat gearwheel. The ring-shaped permanent magnet 33 is installed on the ring-shaped support plate 39. In the illustrated example, the ring-shaped permanent magnet 33 is arranged at approximately the same height as the substrate 12 so that it surrounds it. A vacuum seal part (not shown in the figures) is provided on an installation part of the support 38 in the center of the base part 11b of the magnetic film-forming chamber 11. A support drive mechanism 41 for the ring-shaped permanent magnet and a rotation mechanism 42 for the substrate-holding platform 31 are installed on the underside of the base part 11b of the magnetic film-forming chamber 11. The support drive mechanism 41 is a mechanism which, while supporting the ring-shaped support plate 39, rotates the ring-shaped support plate 39 by means of a composite part formed from a motor 41a, two gearwheels 41b, a rotating input mechanism 41c, a rotating axle 41d and a miniature flat gearwheel 41e. In the support drive mechanism 41, the motor 41a and rotating input mechanism 41c are mounted on a support plate 41f. The support drive mechanism 41 can itself move up and down as shown by the broken line and arrow 43. This up and down movement takes place by means of the extension and retraction movements of a cylinder device 41g installed between the support plate 41f and base plate 44. As a result, the ring-shaped permanent magnet 33 is moved up and down inside the magnetic film-forming chamber 11. When measurements are carried out on the magnetic film by means of RHEED (Reflection High Energy Electron Diffraction) provided inside the vacuum chamber, in order to check the film quality by way of the atomic arrangement, crystal growth mode, and the like, the permanent magnet 33 is moved downward in order to avoid the permanent magnet 33 influencing the measurement. In addition, the rotation mechanism 42 of the substrate-holding platform is composed of a motor 42a fixed to the base plate 44, two flat gearwheels 42b, a rotating axle 42c, and a miniature flat gearwheel 42d. The miniature flat gearwheel 42d is coupled to the above-mentioned flat gearwheel 40. When the motor 42a carries out a rotational movement, the substrate-holding platform 31 and the substrate 12 mounted thereon are made to rotate by means of the rotational power transmission mechanism. As the rotation mechanism 42 is installed without a connection to the support drive mechanism 41 for the ring-shaped permanent magnet, it does not move up and down. It is to be noted that in the above-mentioned configuration, a vacuum seal part (not shown in the Figures) is provided in the insertion part of the rotating axles 41d and 42c. In addition, the rotation of the motor 41a and motor 42a is synchronized. Instead of a gearwheel, a pulley or the like can be used as the rotational power transmitting mechanism.

Next, a detailed description will be given of the interior of the cleaning processing chamber 13 and its surroundings with reference to FIGS. 4 to 9.

A horseshoe-shaped substrate-holding part 51 is provided in the interior of the cleaning processing chamber 13. The substrate-holding part 51 is formed from a first insulator. A hole 13b is formed in the center of the base wall 13a of the cleaning processing chamber 13 and a ring-shaped insulator 52 is provided on the inner edge side of the hole 13b. A first metal plate 53 and a second metal plate 54, made of stainless steel material, are installed one on top of the other on the ring-shaped insulator 52. A platform is formed by the first metal plate 53 and the second metal plate 54. A gap 55 is formed as a path along which cooling water is made to flow between the first metal plate 53 and the second metal plate 54. The cooling water is supplied in the above-mentioned gap 55 by a cooling water supply pipe 56 as shown by the arrow 57. In addition, a high-frequency power source 58 is connected, via an adjustment circuit 59, to the first metal plate 53 on the underside which forms the base platform. Another ring-shaped insulator 60 is also provided on the periphery of the ring-shaped insulator 52 and the second metal plate 54. A support plate 61 is installed on the ring-shaped insulator 60 and the second metal plate 54. The support plate 61 is formed from a second insulator. A ring-shaped wall part 62 is provided on the circumference of the outer ring-shaped insulator 60. A ring-shaped shield wall 63, which is formed from aluminum, is installed on the ring-shaped wall part 62.

High frequency electric power is applied to the support plate 61 via the first metal plate 53 and the second metal plate 54 by means of the high-frequency power source 58.

Figure 5:
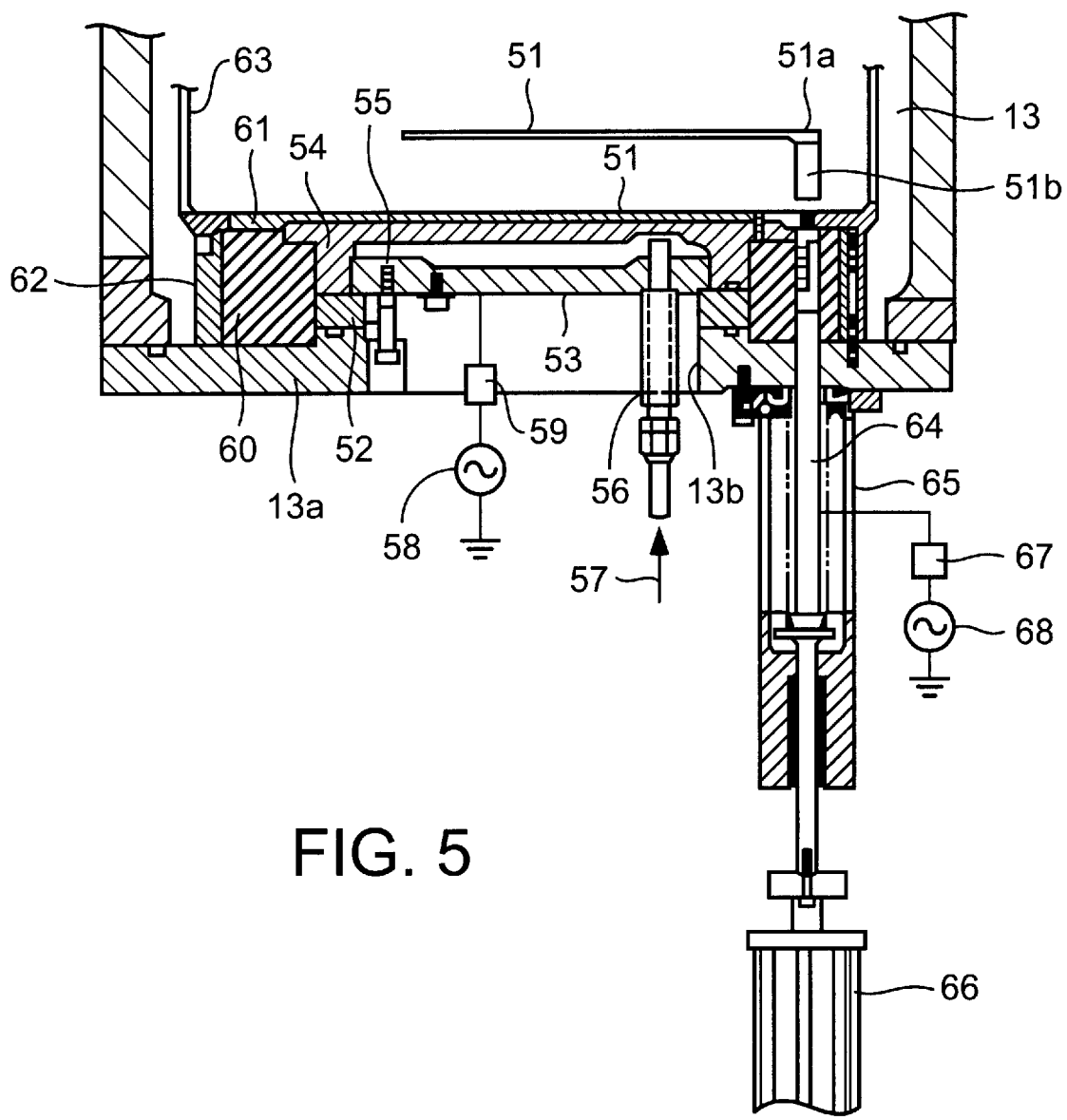
FIG. 5 is a partial vertical sectional view showing the configuration of the main elements of a cleaning processing chamber according to the present invention.
Figure 6:
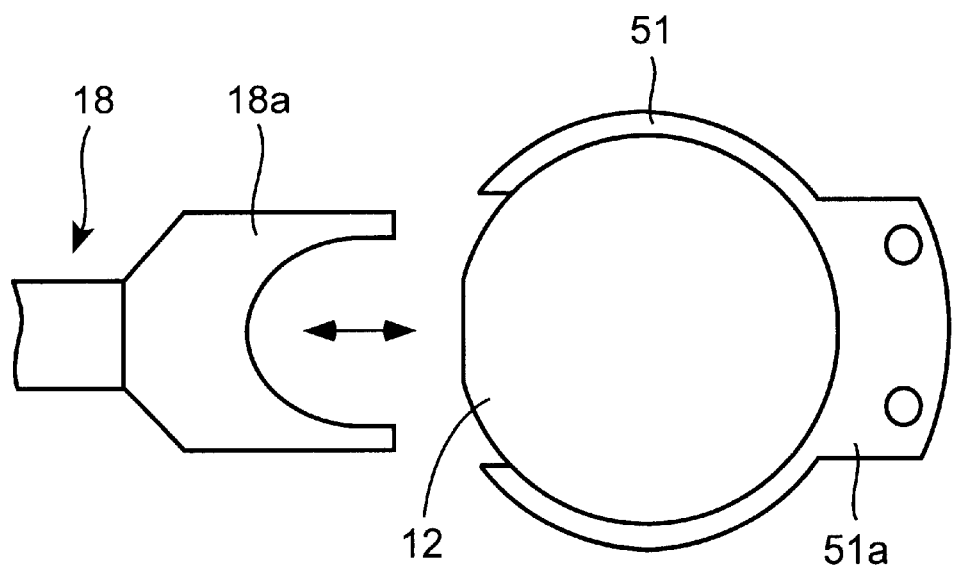
FIG. 6 is a plan view showing the relationship between a substrate-holding part of a cleaning processing chamber and a robot arm according to the present invention.
Figure 7:
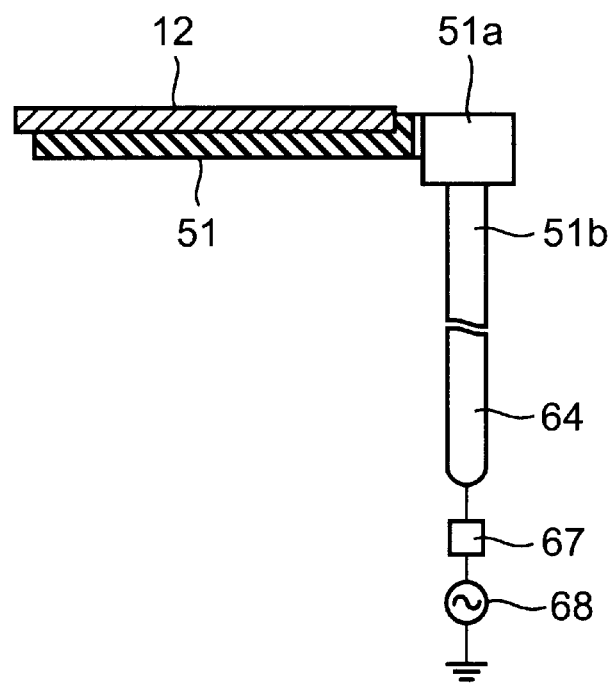
FIG. 7 is a side view of a horseshoe-shaped substrate-holding part according to the present invention.
Figure 8:
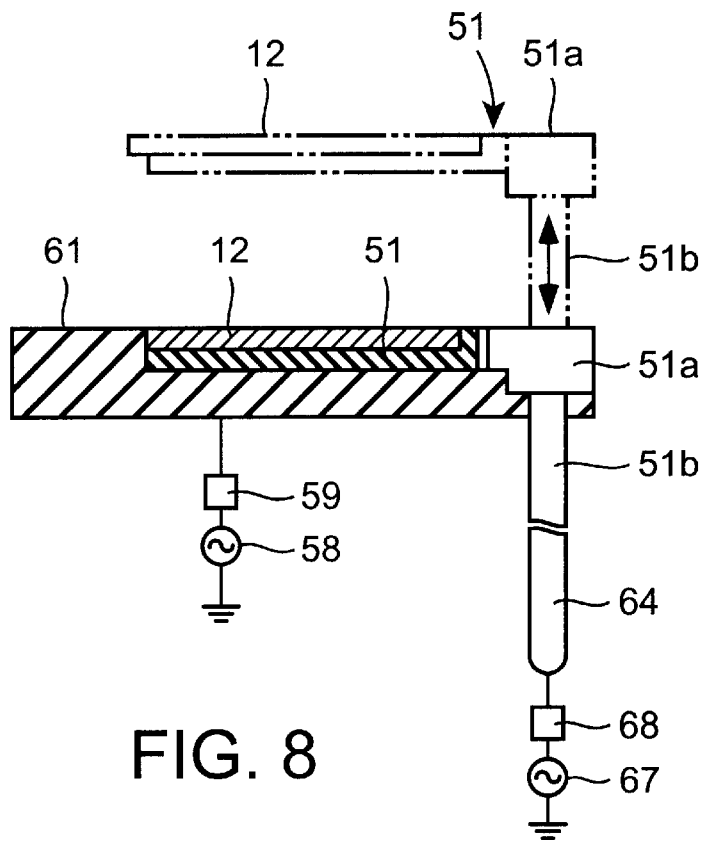
FIG. 8 is a side view of a support plate (second insulator) and horseshoe-shaped substrate-holding part according to the present invention.
Figure 9:
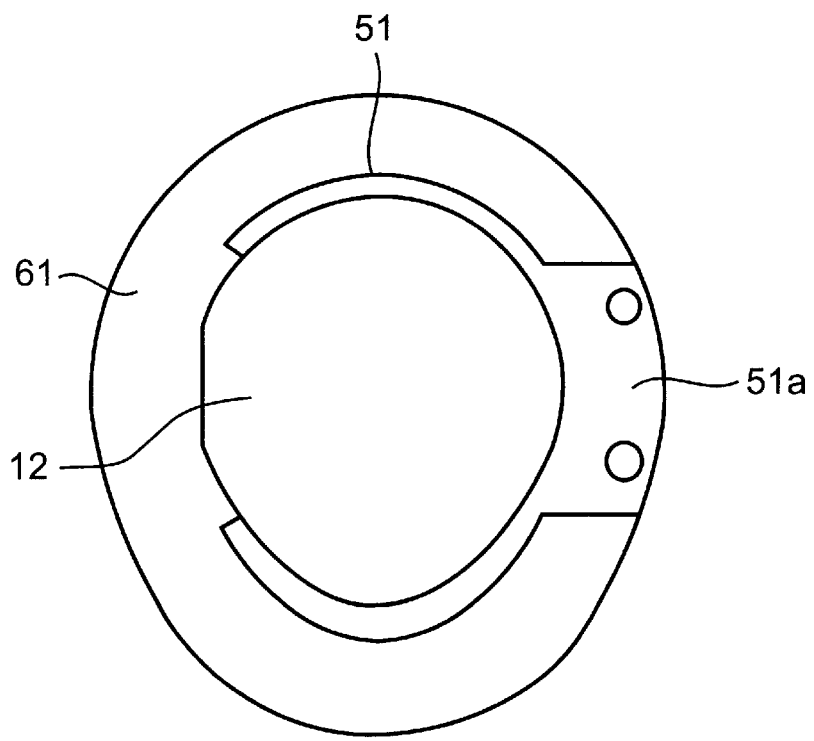
FIG. 9 is a plan view of a support plate (second insulator) and a horseshoe-shaped substrate-holding part according to the invention.

In the horseshoe-shaped substrate-holding part 51, as shown in FIGS. 5 and 6, the substrate-mounting part is arranged approximately horizontally and the support part 51b is installed facing downward on the base part 51a of the substrate-holding part 51. The support part 51b of the substrate-holding part 51 is coupled to the metal support axle 64 which is arranged facing downward. The support axle 64 extends down from the base wall 13a of the cleaning processing chamber 13 by passing through a hole formed in the insulator 60 and the base wall 13a. The support axle 64 is inserted into a support tube part 65, which is fixed to the underside of the base wall 13a, and the support axle 64 is installed in a state in which it is supported by means of the support tube part 65, in such a way that it can move up and down. The support axle 64 extends from the lower end of the support tube part 65 in the lower part of the support axle 64 in the downward direction and is coupled to a drive device 66. According to the configuration above, the substrate-holding part 51 is held in a raised position or in a lowered position as shown in FIG. 5 or FIG. 8, as a result of the drive movements of the drive device 66. In the lowered position, the substrate-holding part 51 is arranged on the support plate 61. In the raised side position, any desired height can be adopted as will be described below.

In the above-mentioned supporting axle 64, a high frequency power source (high frequency power application mechanism) 68 is connected via an adjustment circuit 67. By means of this configuration, high frequency power is applied to the substrate-holding part 51.

The high frequency power source 58 and the high frequency power source 68 are contained in the high frequency power supply part shown in FIG. 1.

In the cleaning processing chamber 13, the substrate 12, which is introduced into the cleaning processing chamber 13 via the end part 18a of the robot arm 18 is, as shown for example in FIG. 6, installed on the horseshoe-shaped substrate-holding part 51. The respective substrate-holding part 51 is formed from the above-mentioned first insulator. It is preferable to use quartz as this insulator. In addition, it is preferable to use quartz as the insulator which forms the insulator part 60 and the support plate 61. It is to be noted that $Al_2O_3$ can be used in the insulator 60.

The conveying of the substrate 12 into the cleaning processing chamber 13 by means of the robot arm 18, causes the robot arm 18 at whose end 18a the substrate 12 is held firstly to move into a position directly above the horseshoe-shaped substrate-holding part 51. Next, the horseshoe-shaped substrate-holding part 51 moves upward taking up the substrate 12 in the approximately circular groove on the substrate-holding part 51. After the substrate 12 has been placed on the substrate-holding part 51, the robot arm 18 is withdrawn, the gate valve 17B is closed, the interior of the cleaning processing chamber 13 is evacuated by means of the vacuum pump 71 and pressure in the interior is reduced.

At the time of the cleaning processing, the horseshoe-shaped substrate-holding part 51 is arranged in a position which is at least 40 mm, preferably 50 to 60 mm or more, from the lower support plate 61 which is formed from quartz. The pressure, at the time when it has reached the specific pressure appropriate for the cleaning of substrate 12, in the cleaning processing chamber 13 is provided by an etching gas such as Ar gas from a gas supply part 22 and by this means the interior is set to a pressure of 0.2 Pa. High frequency power is applied to the substrate-holding part 51 by means of the high frequency power source 68 connected to the horseshoe-shaped substrate-holding part 51. By this means, plasma is generated in the gap between the front face of the substrate 12 which is placed in the substrate-holding part 51 and the wall face of the cleaning processing chamber 13, and in the gap between the reverse face of the substrate 12 and the support plate 61.

The support plate 61, i.e. the second insulator part, is arranged in the structure, but this structure is not essential and can be omitted. In the event of there being no insulator 61, plasma is generated between the substrate 12 and the inner wall face of the lower part 13a of the cleaning processing chamber 13.

In all cases when the above-mentioned plasma is generated, the substrate 12 is cleaned by the generated Ar plasma within a time of several seconds to several minutes.

As described above, the results of measuring the MR ratio of the elements of $Ni_{80}Fe_{20}$ deposited to a thickness of 10 nm under the conditions in table 1 given below for a substrate 12 which has been cleaned for 1 minute at an Ar pressure of 0.2 Pa and a high frequency (RF) power of 100 W, are shown in table 3 given below. According to the table, it is apparent that the MR ratio is improved approximately twofold by the cleaning. In addition, it is apparent that cleaning not only the reverse face of the substrate but rather both faces of the substrate makes it possible to obtain a better effect. These elements of NiFr single film are used within a customary MR ratio range of 2.0 to 3.0. These values can be obtained easily by suitably setting the film thickness. It is assumed that, in the same way that such results can be obtained with an NiFe single film good effects can be obtained also with the above-mentioned GMR or TMR or corresponding MRAM, which have a structure in which a plurality of magnetic films are deposited.

As also described, it is possible not only to apply high frequency power to the horseshoe-shaped substrate-holding part 51 but also high frequency power can be applied to the support plate 61, which is arranged below the horseshoe-shaped substrate-holding part 51. In this case, plasma is generated in the space between the reverse face of the substrate 12 and the second insulator 61. By suitably setting the distance between the two and the etching gas pressure, it is possible in this case to etch both sides, because a thin layer of plasma also circulates on the reverse face of the substrate.

It is known that if semiconductor elements, in particular MOS (metal oxide silicon) structures, are formed on the reverse face of the substrate 12, the problem of charging up occurs, but this problem can be avoided by selecting the cleaning conditions. In other words, the cleaning conditions on the front face side of the substrate can be set such that charging up does not occur. For this reason, plasma is generated by assigning suitable conditions to both the horseshoe-shaped substrate-holding part 51 and the support plate 61. As the plasma density of the reverse face side of the substrate can be increased, it is possible to carry out etching on both sides, even if etching is performed simultaneously, without damaging the front face. Furthermore, the charging-up problem can be avoided by supplying high frequency power to the horseshoe-shaped substrate-holding part 51 for a short time of only several seconds and supplying high frequency power to the support plate 61 for 1 to 2 minutes.

On the other hand, lowering the horseshoe-shaped substrate-holding part 51 and placing it in the groove on the support plate 61 causes the reverse face of the substrate 12 and the support element 61 to be in contact, making it impossible to form a gap. As a result of this, applying high frequency power either to the substrate-holding part 51 or the support plate 61, or to both, exposes only the reverse face of the substrate 12 to plasma. It is possible to clean only the reverse face of the substrate in this way.

As the magnetic film-forming device according to the present embodiment has a structure, as above, for carrying out cleaning processing prior to film formation, with the present embodiment the substrate face can be mounted in either direction and the substrate can be mounted easily in accordance with the magnetic film-forming process which takes place from the cleaning process onward.

The film-forming conditions of the NiFe magnetic film which are implemented in the magnetic film-forming chamber 11 according to the present embodiment are shown in table 1, the cleaning conditions for the cleaning processing carried out in the cleaning processing chamber 13 are shown in table 2, and the relationship between the resistivity (r) of the NiFe magnetic film and the plasma cleaning (experimental results showing the effects of the cleaning) is shown in table 3.

TABLE 1

| Film-forming method | Static opposition |
|---|---|
| Cathode | Diam. 12.5 magnetizing force rotating cathode |
| Target | Ni 80 FE 20 |
| Substrate | Diam 6 in × 2 t |
| Pressure attained | $2.5 \times 10^{-6}$ Pa |
| Film-forming pressure | 0.6 Pa |
| T/S distance | 350 mm |
| Input pressure | DC200W |
| Magnetizing force applied | 80 Oe |
| Film-forming time | 3 minutes 13 seconds |
| Film thickness | 10 nm |

TABLE 2

| Ar pressure | 0.2 Pa |
|---|---|
| RF power | 100 W |
| Cleaning time | 1 minute |

TABLE 3

| | Resistivity ($\mu \Omega$m) | MR ratio (%) |
|---|---|---|
| Without cleaning | 57 | 0.7 |
| Cleaning of front face of substrate | 39 | 1.4 |
| Cleaning of front and reverse faces of substrate | 36 | 1.5 |

From the above results it is apparent that when the magnetic film-forming method is carried out using the magnetic film-forming device 10 according to the present embodiment the resistivity value is reduced and the rate of change of the magnetoresistance is improved twofold with respect to a case in which cleaning is not carried out.

It is to be noted that the front face and reverse face of the substrate can be cleaned by means of an excitation source such as an ion beam or laser beam. In the case of an ion beam, all the faces of the substrate can be cleaned by cleaning the front face of the substrate by deflecting the beam once to the front face of the substrate and scanning the beam over the front face of the substrate by means of an electric potential deflecting plate, and then scanning the beam over the reverse face of the substrate. In the case of a laser beam, both sides can be cleaned by installing a mirror.

A description will be given of the method of manufacturing GMR elements on a substrate 12 in a magnetic film-forming chamber 11 after the above-mentioned cleaning process has been carried out.

In the state in which the gate valve 17C is closed, the magnetic film-forming chamber 11 in which the magnetic film-forming processing is carried out is evacuated to form an extremely high vacuum of approximately $1 \times 10^{-7}$ Pa or less by means of the vacuum pump 34. Six cathode units 32 are arranged at equal intervals in the ceiling part 11a of the magnetic film-forming chamber 11.

In addition, as disclosed in Japanese Laid-Open Patent Application No. H11-08000, the thickness of film can be made uniform by injecting sputter particles obliquely while rotating the substrate 12.

Figure 10:
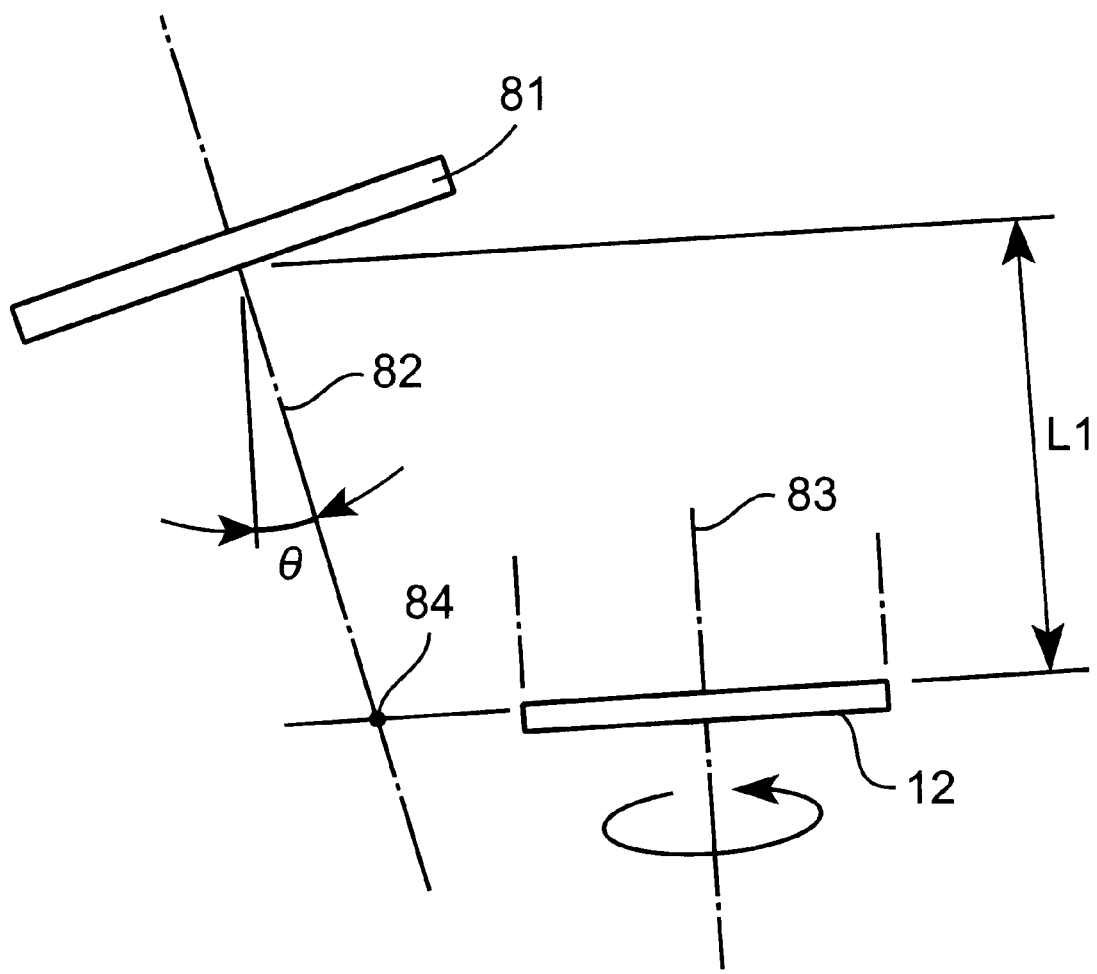
FIG. 10 is an explanatory view showing the relative arrangement of a cathode and a substrate according to the invention.
Figure 11A:
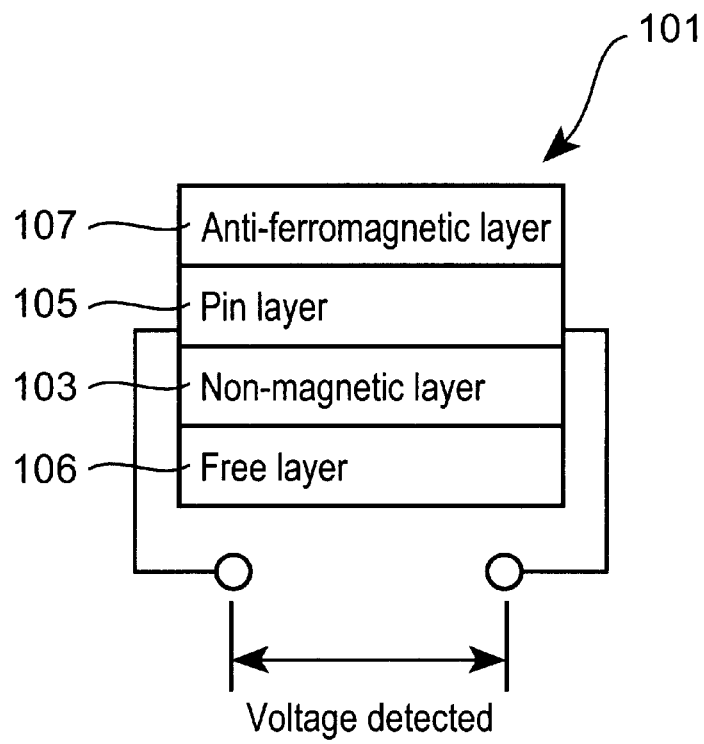
FIG. 11(A) is a view showing in outline the multilayer film configuration of a GMR film and FIG. 11(B) is a view showing in outline the multilayer film configuration of a TMR film.
Figure 11B:
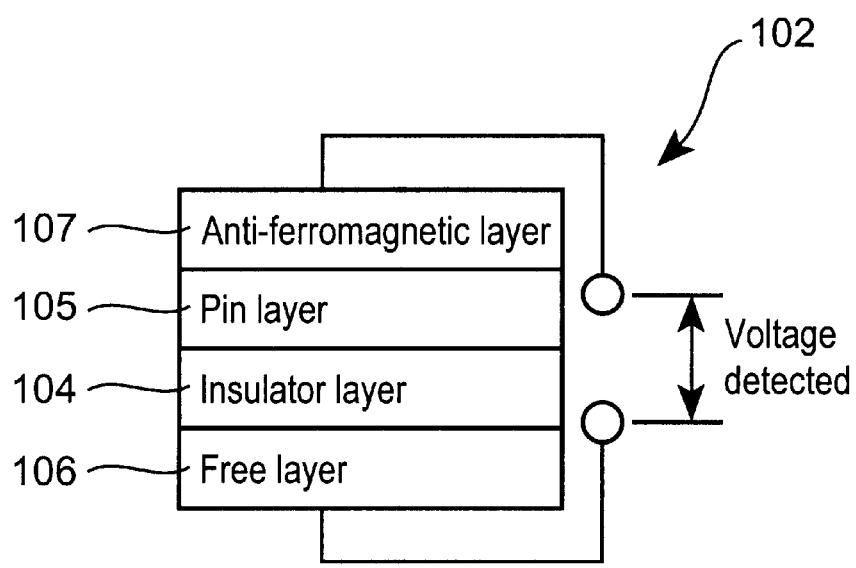
Figure 12:
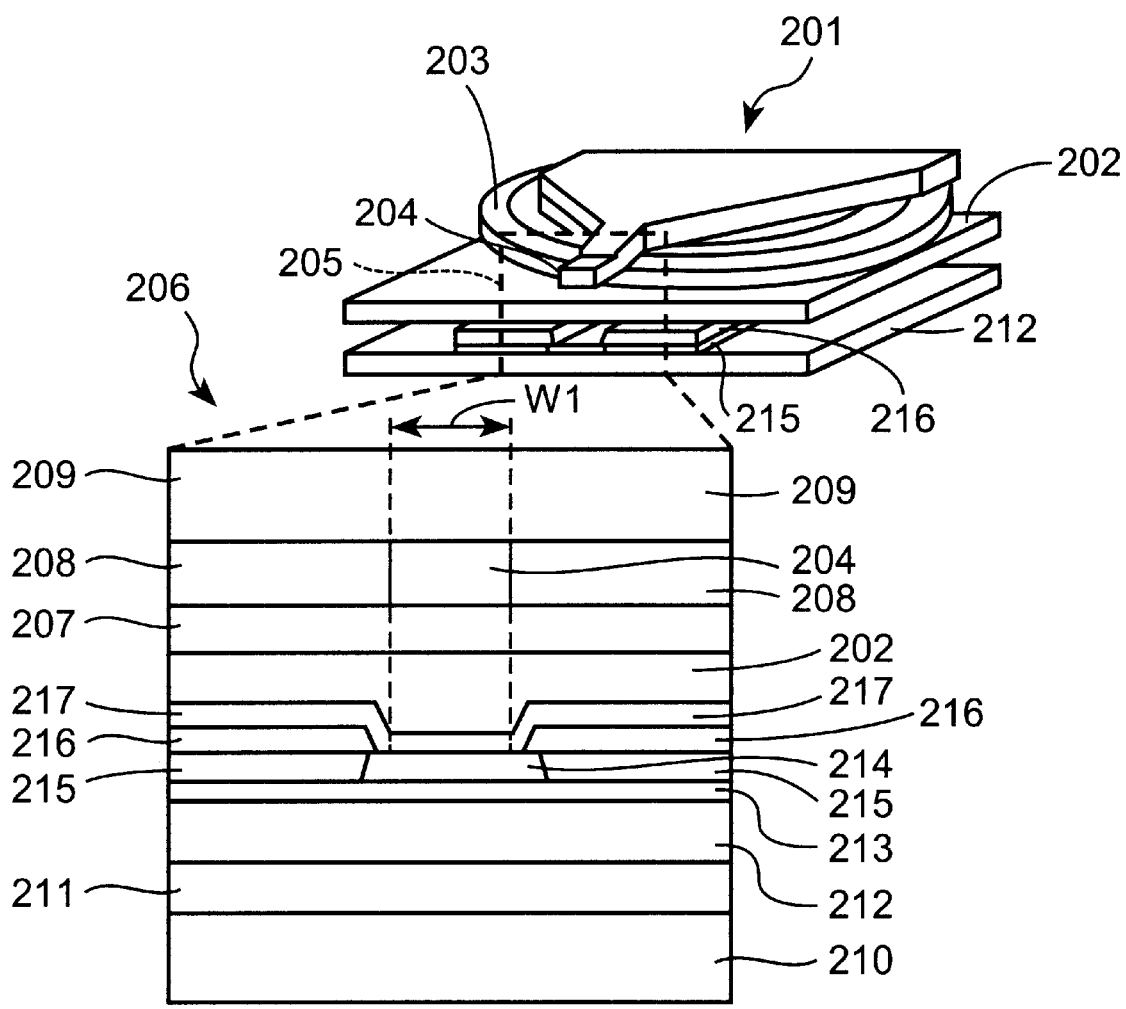
FIG. 12 is a view explaining a magnetic head (GMR head) and its film structure.
Figure 13:
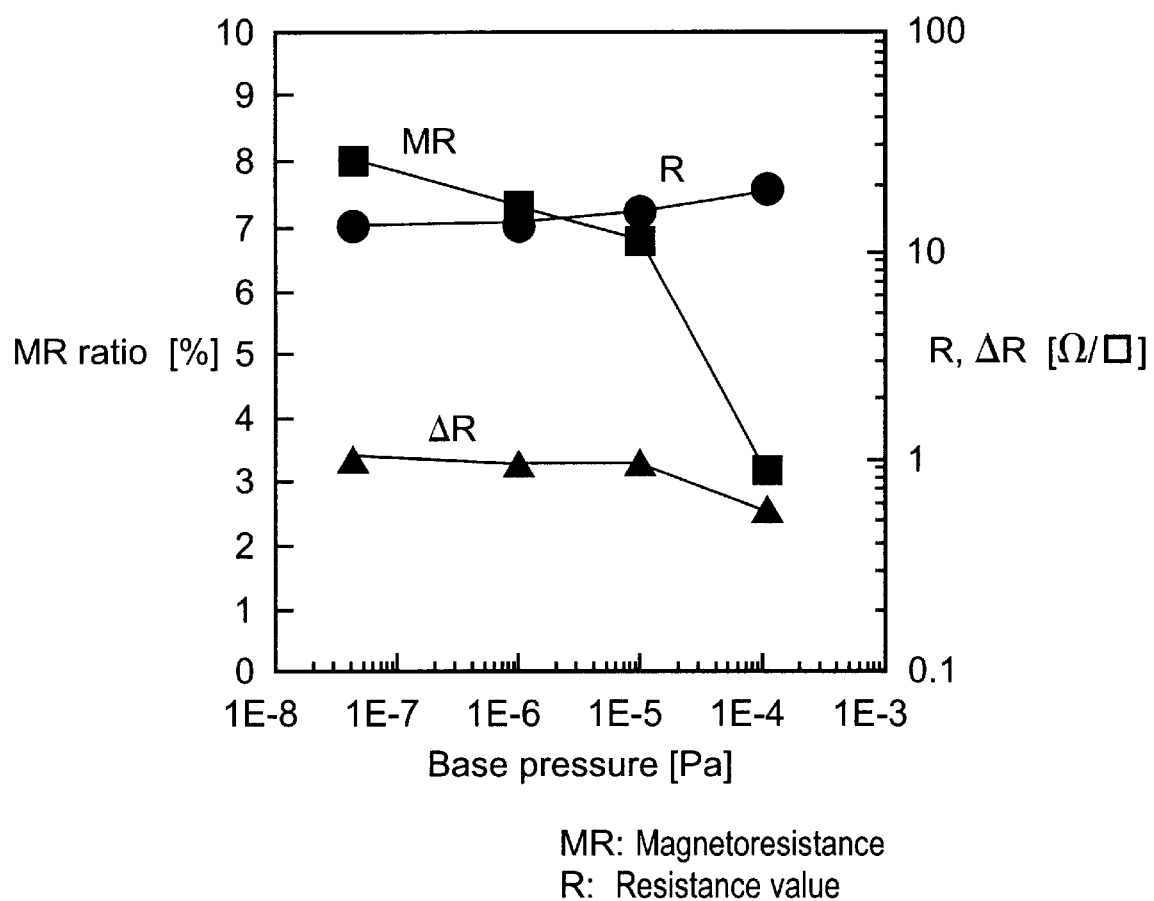
FIG. 13 is a graph showing the properties of the change in the change ratio (MR) and the resistance value (R) related to the base pressure.

By means of the present embodiment it is possible, as shown in FIG. 10, to obtain a distribution of the resistivity (R) of ±1.0% or less by making the distance (L1) between the center line 82 of the target and the point 84 where the center line of the target intersects the plane which includes the substrate 12 200 mm at the same time as the angle (θ) between the center line 82 of the target 81 and the normal line 83 of the substrate 12 is set to 15°. In addition, because a good quality film with a small percentage by weight of impurities and a low resistivity (ρ) can be obtained when the back pressure is low, it is possible to conceive of substituting the distribution of the thickness of the film for the distribution of the resistance. When Al film deposition is being carried out with a large dependence of the resistance on the percentage by weight of impurities and when the distance between the target and the substrate is 190 mm, a distribution of the resistance, i.e., a distribution of the thickness of the film of ±0.3% or less is obtained.

After it has been confirmed that the substrate on whose front face an integrated circuit is formed by means of semiconductor manufacturing processes has, as mentioned above, been conveyed into the magnetic film-forming chamber 11 and then the chamber has been evacuated, and that the back pressure is an extremely high vacuum of approximately $1 \times 10^{-7}$ Pa or less, a specific amount of Ar gas is introduced from a gas supply part 22, electrical discharge is applied to the Ta target and a Ta film is formed to a thickness of 5 nm. At this time, the substrate-holding part 31 maintains a certain constant position with respect the substrate 12 and rotates. By this means, the substrate 12 is always in the center space of the permanent magnet 33 in which the magnetic field is generated and is exposed to the generated magnetic field.

Next, NiFe, which is a free layer, is formed to a thickness of 5 nm. At this time also the easy axis of magnetism is induced in the NiFe film in the direction of the applied magnetizing force because a magnetic field in a constant direction is applied.

Next, Co or CoFe film is formed to a thickness of 1 nm. After the formation of CoFe, the position of the permanent magnet 33 is adjusted in such a way that the direction of the magnetic field and the direction when the free layer is formed are orthogonal.

After this, a Cu film is formed to a thickness of 2.5 mn and a Co or CoFe film, is formed to a thickness of 3 nm.

Next, FeMn is formed to a thickness of 10 nm, and finally a Ta film is formed to a thickness of 3 nm. On the basis of this sequence, a stacked film with a GMR structure is fabricated.

The above description relates to the manufacture of GMR elements but it can also be implemented in the same way for TMR elements. In the case of TMR elements, an insulator film such as $Al_2O_3$ or the like is formed between the pin layer and the free layer. After an Al film has been deposited by means of DC sputtering in the magnetic film-forming chamber in the same way as magnetic film is formed as mentioned above, an insulator film such as $Al_2O_3$ or the like is formed by oxide processing by means of oxide processing using oxygen and an oxidizing agent such as ozone, and exposure to oxygen plasma in a separate chamber. It is to be noted that after trimethyl aluminum has been deposited, the substrate can be conveyed into the magnetic film-forming chamber 11 and the second magnetic film, the Al film, can be oxidized by means of plasma CVD using a reactive gas. After this, the substrate is conveyed in turn into another magnetic film-forming chamber and a second magnetic film is formed. In this way, it is possible to form memory elements such as a MRAM non-volatile memory.

By means of the present invention described above, it is possible, when manufacturing multilayer film such as GMR film on a substrate, to remove the gas molecules adsorbed into the front and reverse faces of the substrate, and the impurities, because a configuration is provided in which either or both of the front face and reverse face of the substrate are cleaned before or during the deposition of the magnetic film on the substrate. In particular, as gas can be discharged from the reverse face of the substrate, the film quality of the magnetic film is improved, the evacuation can be performed in a short time and furthermore by this means productivity can be increased.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A magnetic film-forming device which deposits magnetic material on a substrate and forms a magnetic film on the substrate, the device comprising:

a cleaning mechanism which, before the magnetic film is formed, cleans either one or both of the film-forming face and reverse face of the substrate;

wherein the cleaning mechanism is provided with a high frequency power supplying device which applies high frequency power to the substrate;

wherein the high frequency power supplying device is provided with a horseshoe-shaped insulator substrate-holding part which is capable of moving up and down.

2. The magnetic film-forming device as claimed in claim 1, wherein the high frequency power supplying device is provided with an insulator which is arranged on a lower part of the substrate-holding part.

3. The magnetic film-forming device as claimed in claim 2, wherein quartz is used in the insulator substrate-holding part and the insulator.

4. The magnetic film-forming device as claimed in claim 1, wherein quartz is used in the insulator substrate-holding part.

5. A magnetic film-forming device which deposits magnetic material on a substrate and forms a magnetic film on the substrate, the device comprising:

a cleaning mechanism which, before the magnetic film is formed, cleans either one or both of the film-forming face and reverse face of the substrate;

a load lock chamber into which the substrate is introduced and a magnetic film forming chamber in which the magnetic film is formed on the substrate, wherein the cleaning mechanism includes a cleaning processing chamber which is provided with a cleaning device, the cleaning processing chamber is installed between the load lock chamber and the magnetic film-forming chamber;

the load lock chamber is connected in an airtight manner to the cleaning processing chamber, and the cleaning processing chamber is connected in an airtight manner to the magnetic film-forming chamber; and the cleaning of the substrate and the formation of the magnetic film on the substrate are carried out continuously without the substrate being exposed to atmosphere.

6. The magnetic film-forming device as claimed in claim 5, wherein the cleaning mechanism is provided with a high frequency power supplying device which applies high frequency power to the substrate.

7. A magnetic film-forming method, comprising the steps of:

depositing a magnetic material on a film-forming face of a substrate to form a magnetic film; and before the depositing step, cleaning both the film-forming face and a reverse face of the substrate;

wherein the substrate is not exposed to atmosphere between the cleaning step and the depositing step.

8. A magnetic film-forming method, comprising the steps of:

depositing a magnetic material on a film-forming face of a substrate to form a magnetic film; and before the depositing step, cleaning a reverse face of the substrate;

wherein the substrate is not exposed to atmosphere between the cleaning step and the depositing step.

9. The magnetic film-forming method as claimed in claim 8, wherein the cleaning is carried out by applying high frequency power to the substrate.

10. A magnetic film-forming device, comprising:
a magnetic film-forming chamber in which a magnetic material is deposited on a substrate to form a magnetic film on the substrate,
a cleaning mechanism which, before the magnetic film is formed, cleans at least one surface of the substrate; and
a central conveying chamber that is connected to the magnetic film-forming chamber and the cleaning mechanism in an air-tight manner.

11. A magnetic film-forming device, comprising:
a magnetic film-forming chamber in which a magnetic material is deposited on a substrate to form a magnetic film on the substrate, and
a cleaning mechanism which, before the magnetic film is formed, cleans at least one surface of the substrate;
wherein the cleaning mechanism cleans both a reverse face and a film-forming face of the substrate.

12. A magnetic film-forming device, comprising:
a magnetic film-forming chamber in which a magnetic material is deposited on a substrate to form a magnetic film on the substrate,
a cleaning mechanism which, before the magnetic film is formed, cleans at least one surface of the substrate;
a load lock chamber into which the substrate is introduced, wherein the cleaning mechanism includes a cleaning processing chamber which is provided with a cleaning device, the cleaning processing chamber is installed between the load lock chamber and the magnetic film-forming chamber;
the load lock chamber is connected in an airtight manner to the cleaning processing chamber, and the cleaning processing chamber is connected in an airtight manner to the magnetic film-forming chamber; and
the cleaning of the substrate and the formation of the magnetic film on the substrate are carried out continuously without the substrate being exposed to atmosphere.

13. The magnetic film-forming device as claimed in claim 12, wherein the cleaning mechanism is provided with a high frequency power supplying device which applies high frequency power to the substrate.

14. A magnetic film-forming device, comprising:
a magnetic film-forming chamber in which a magnetic material is deposited on a substrate to form a magnetic film on the substrate, and
a cleaning mechanism which, before the magnetic film is formed, cleans at least one surface of the substrate;
wherein the cleaning mechanism is provided with a high frequency power supplying device which applies high frequency power to the substrate; and
wherein the high frequency power supplying device is provided with a horseshoe-shaped insulator substrate-holding part which is capable of moving up and down.

15. The magnetic film-forming device as claimed in claim 14, wherein quartz is used in the insulator substrate-holding part.

16. The magnetic film-forming device as claimed in claim 14, wherein the high frequency power supplying device is provided with an insulator which is arranged on a lower part of the substrate-holding part.

17. The magnetic film-forming device as claimed in claim 16, wherein quartz is used in the insulator substrate-holding part and the insulator.

18. A magnetic film-forming method, comprising the steps of:
depositing a magnetic material on a substrate to form a magnetic film; and
before the depositing step, cleaning either one or both of the film-forming face and the reverse face of the substrate;
wherein the substrate is not exposed to atmosphere between the cleaning step and the depositing step.

19. The magnetic film-forming method as claimed in claim 18, wherein the cleaning is carried out by applying high frequency power to the substrate.

20. The magnetic film-forming method as claimed in claim 18, wherein the cleaning is carried out by applying high frequency power to the substrate.

21. The magnetic film-forming method as claimed in claim 18, wherein the cleaning and the magnetic film formation are carried out at different places.

* * * * *